(12) United States Patent
Duan et al.

(10) Patent No.: US 8,383,936 B2
(45) Date of Patent: Feb. 26, 2013

(54) GROUNDING MECHANISM FOR SLIDE-TYPE ELECTRONIC DEVICES

(75) Inventors: Chao Duan, Shenzhen (CN); Chia-Hua Chen, Taipei (TW)

(73) Assignees: Shenzhen Futaihong Precision Industry Co., Ltd., Shenzhen (CN); FIH (Hong Kong) Limited, Kowloon (HK)

( * ) Notice: Subject to any disclaimer, the term of this patent is extended or adjusted under 35 U.S.C. 154(b) by 242 days.

(21) Appl. No.: 12/844,982

(22) Filed: Jul. 28, 2010

(65) Prior Publication Data

US 2011/0266020 A1   Nov. 3, 2011

(30) Foreign Application Priority Data

Apr. 28, 2010   (CN) .......................... 2010 1 0158502

(51) Int. Cl.
*H05K 5/02*   (2006.01)
(52) U.S. Cl. ......... 174/51; 174/53; 174/54; 361/679.01; 361/679.02; 361/679.03; 361/679.04
(58) Field of Classification Search .................. 174/50, 174/51, 535; 361/600, 752, 117, 679.08; 439/98
See application file for complete search history.

(56) References Cited

U.S. PATENT DOCUMENTS

| | | | | |
|---|---|---|---|---|
| 4,599,484 A * | 7/1986 | Bramwell | ....................... | 174/50 |
| 5,160,807 A * | 11/1992 | Fry et al. | ....................... | 174/387 |
| 5,339,222 A * | 8/1994 | Simmons et al. | ............. | 361/818 |
| 6,423,915 B1 * | 7/2002 | Winter | ......................... | 200/292 |
| 7,012,571 B1 * | 3/2006 | Ozkar et al. | .................. | 343/702 |
| 7,288,327 B2 * | 10/2007 | Daniel et al. | .................. | 428/599 |
| 7,733,278 B2 * | 6/2010 | Kanasaki et al. | ............. | 343/702 |
| 2008/0277148 A1 * | 11/2008 | Asai et al. | ..................... | 174/255 |
| 2009/0027836 A1 * | 1/2009 | Wakihara | ..................... | 361/679 |
| 2010/0258639 A1 * | 10/2010 | Florek et al. | .................. | 235/492 |

* cited by examiner

*Primary Examiner* — Timothy Thompson
*Assistant Examiner* — Pete Lee
(74) *Attorney, Agent, or Firm* — Altis Law Group, Inc.

(57) ABSTRACT

A grounding mechanism is used for a slidable electronic device including a first housing, a second housing, a conductive member and a grounding tab. The grounding tab is for attachment to the first housing. The receiving portion is formed in the second housing. The conductive member is attached to the receiving portion. The grounding tab contacts the conductive member, the first housing is electrically connected to the second housing.

2 Claims, 7 Drawing Sheets

GROUNDING MECHANISM FOR SLIDE-TYPE ELECTRONIC DEVICES

CROSS-REFERENCE TO RELATED APPLICATION

This application is related to co-pending U.S. patent application Ser. Nos. 12/844,975 and 12/844,978, entitled "GROUNDING MECHANISM FOR SLIDE-TYPE ELECTRONIC DEVICES", by Duan et al., which have the same assignee as the present application. The above-identified application is incorporated herein by reference.

BACKGROUND

1. Technical Field

The disclosure relates to grounding mechanisms and, particularly, to a grounding mechanism used in a slide-type electronic device.

2. Description of Related Art

Slide-type electronic devices have multiple housing elements, such as two housing elements, of which one typically slides over the other to open/close the electronic device. Electromagnetic interference and electrostatic charges are easily produced in the two housings when in use. However, it is difficult to maintain a good grounding because of wear and tear over time from the two housing elements repeatedly moving relative to each other wears the plating on the grounding contact.

Therefore, there is room for improvement within the art.

BRIEF DESCRIPTION OF THE DRAWINGS

Many aspects of the grounding mechanism can be better understood with reference to the following drawings. The components in the drawings are not necessarily drawn to scale, the emphasis instead being placed upon clearly illustrating the principles of the present grounding mechanism. Moreover, in the drawings, like reference numerals designate corresponding parts throughout the several views.

DETAILED DESCRIPTION

The present grounding mechanism may be applied in many different slide-type electronic devices such as mobile phones, game devices, PDAs (personal digital assistant) and others. In an illustrated embodiment, the grounding mechanism is used in a slide-type mobile phone.

Figure 1:
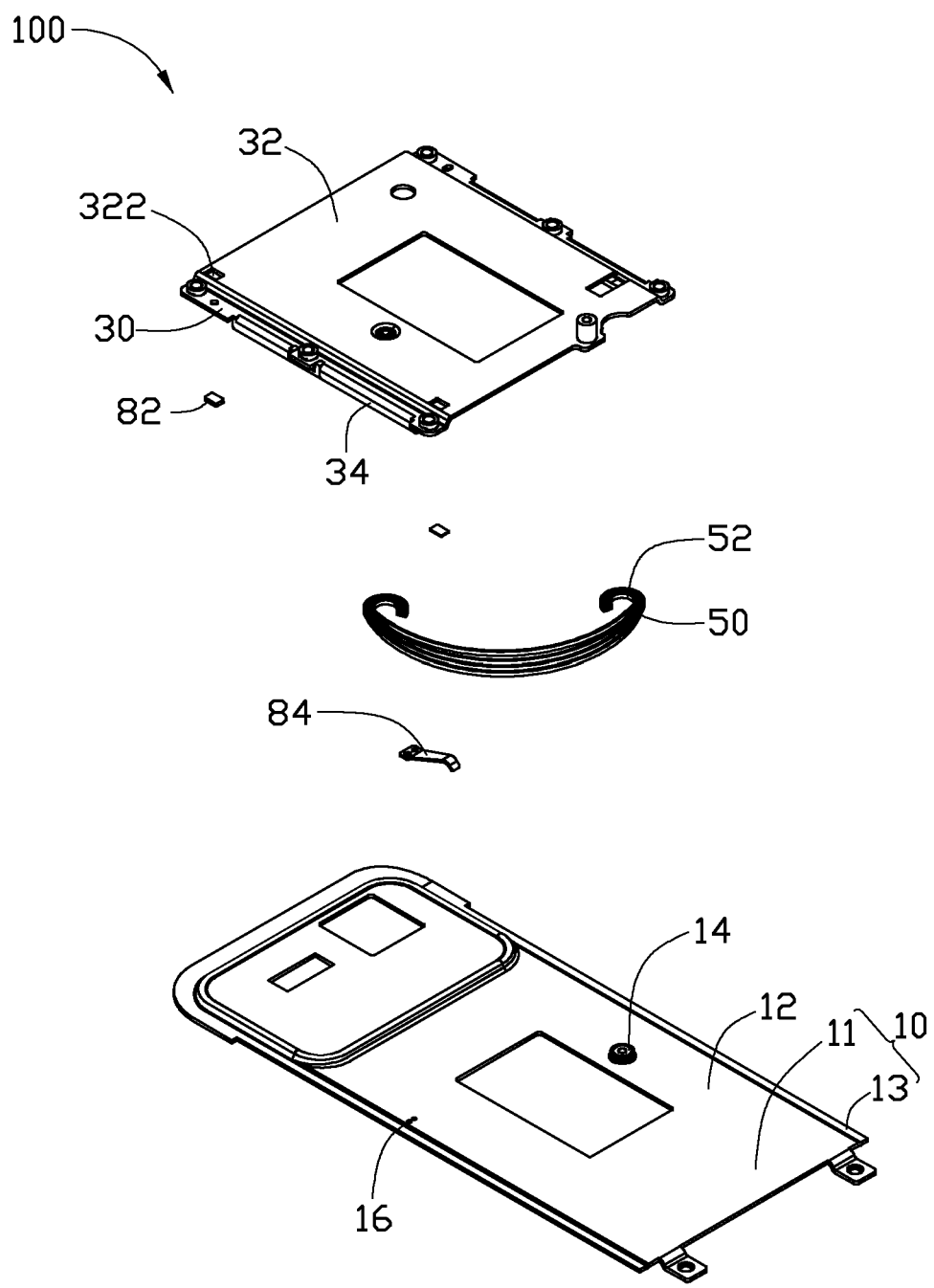
FIG. 1 is an exploded, isometric view of several portions of an electronic device using a grounding mechanism in accordance with an exemplary embodiment.
Figure 2:
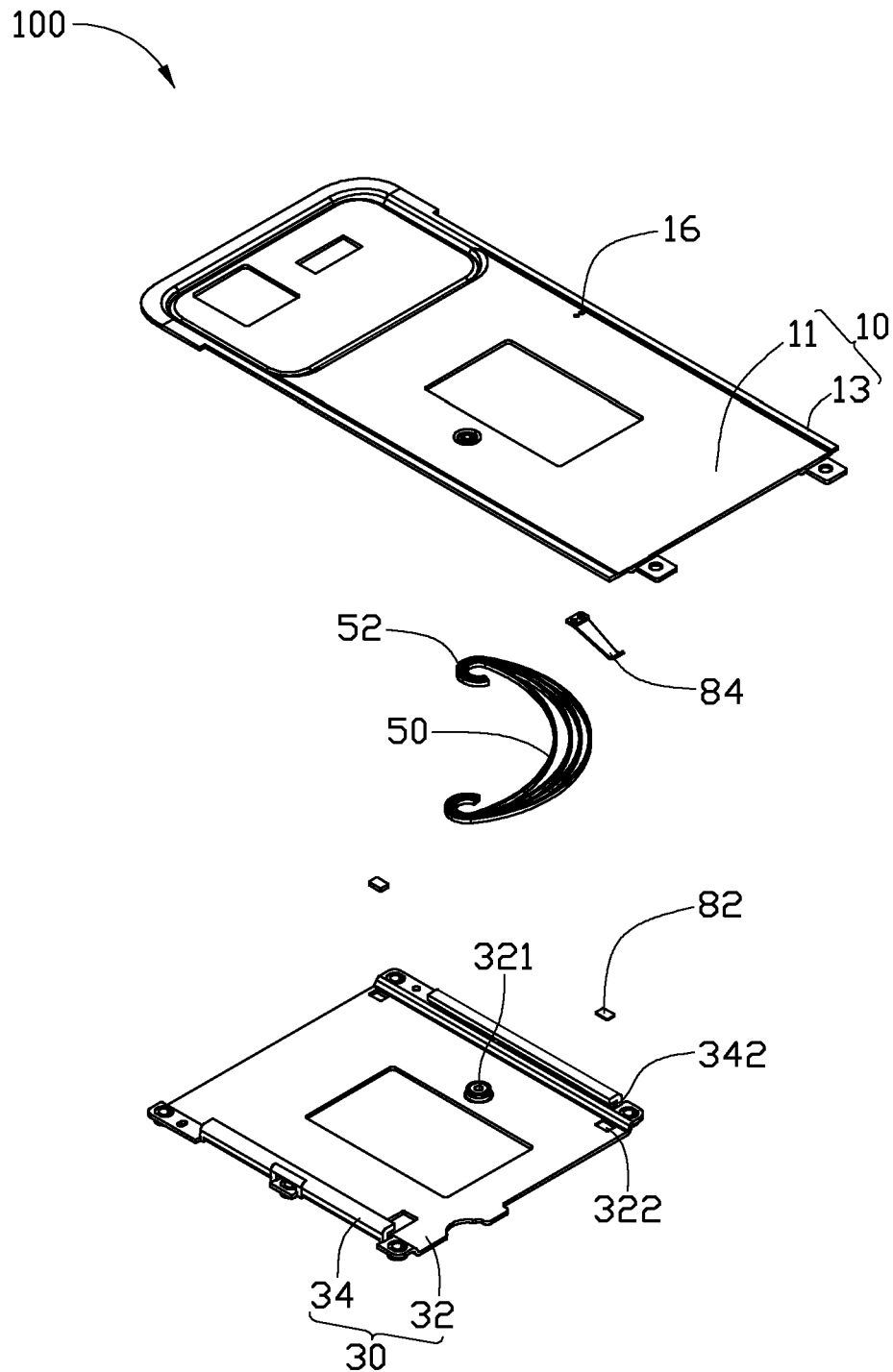
FIG. 2 is similar to FIG. 1, but shown from another aspect.

Referring to FIGS. 1 and 2, the electronic device 100 includes a first housing 10, a second housing 30, an elastic member 50, two conductive members 82 and a grounding tab 84. The elastic member 50 can drive the first housing 10 to slide relative to the second housing 30. The conductive members 82 and the grounding tab 84 can conduct electromagnetic charges from the first housing 10 and the second housing 30 to a ground pin of a printed circuit board (not shown) of the mobile phone 100.

The first housing 10 may be a cover of the electronic device 100. The first housing 10 includes a recessed portion 11 and two rail portions 13 extending from two opposite edge ends of the recessed portion 11. A first post 14 is formed on one surface 12 of the recessed portion 11. Two receiving holes 16 are defined in the surface 12.

The second housing 30 is not as long as the first housing 10. The second housing 30 includes a main plate 32 and two sliding portions 34 at two opposite borders of the main plate 32. The two sliding portions 34 are generally U-shaped bars, and each defines a groove 342 corresponding to one of the two rail portions 13. The rail portions 13 can slide in the grooves 342. A second post 321 is formed on the main plate 32. Two openings 322 are defined in the main plate 32, and each opening 322 is adjacent to one (i.e., the same) end of one sliding portion 34.

The elastic member 50 is made of a plurality of leaf springs, and includes a connecting portion 52 at two ends. The connecting portions 52 are configured to be respectively secured to the first housing 10 and the second housing 30. The elastic member 50 is designed to provide a predetermined torsion to drive the first housing 10 to slide relative to the second housing 30 in two predetermined positions.

Figure 3:
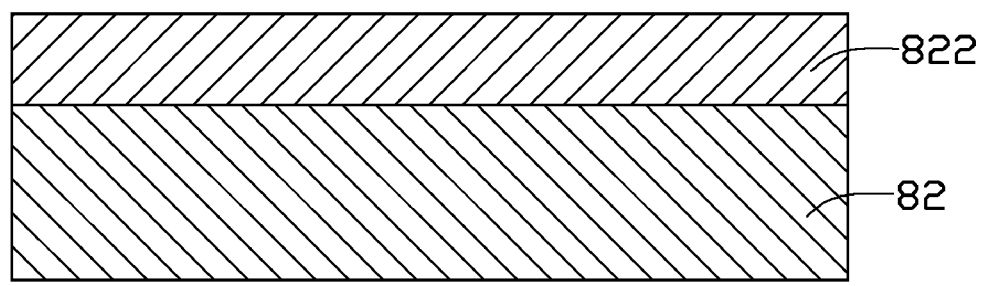
FIG. 3 is a cross-section view of the conductive member.

Referring to FIG. 3, each conductive member 82 is made of metal and configured for being fixed in a corresponding opening 322. A conductive layer 822 is coated on one side of the conductive member 82. In this exemplary embodiment, the conductive layer 822 is a metallic layer made of gold. The gold layer is about 20-250 nm thick depending on cost considerations and wear resistant quality desired and or needed.

Figure 4:
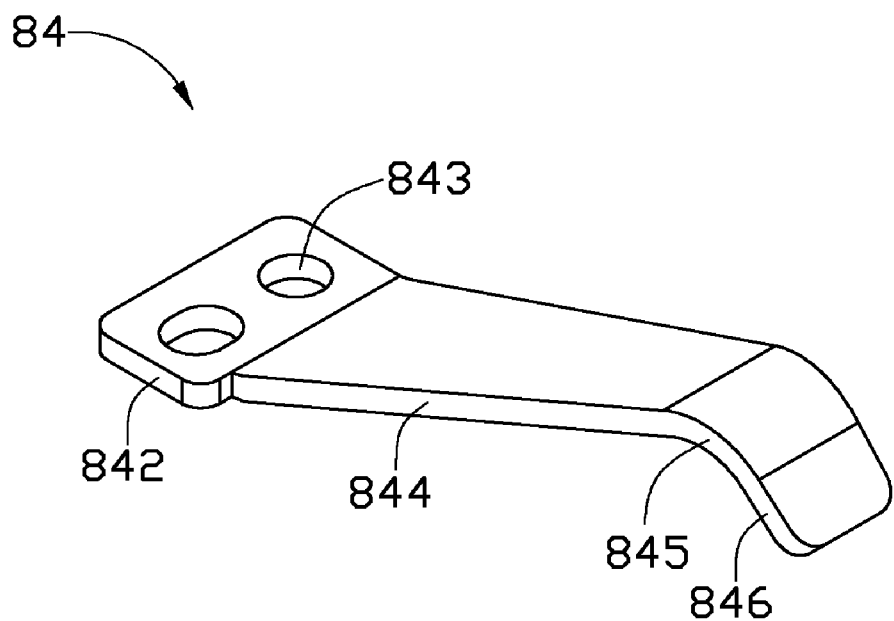
FIG. 4 is an enlarged view of the grounding tab.

Referring to FIG. 4, the grounding tab 84 is made of metal, and may be stamped or punched from a metal sheet. The grounding tab 84 includes a seat portion 842, an angled portion 844, an arcuate portion 845 and an extending portion 846. The seat portion 842 defines two fastener holes 843 corresponding to the receiving holes 16 for mounting the grounding tab 84 to the first housing 10 with fasteners, such as screws/bolts. Alternatively, the seat portion 842 may be fixed to the first housing 10 by way of, for example, welding. The angled portion 844 extends from one end of the seat portion 842. The arcuate portion 845 is connected between the angled portion 844 and the extending portion 846. When the grounding tab 84 is slid relative to the second housing 30 to a closed state or an open state, the arcuate portion 845 alternatively contacts the conductive layer 822 of the conductive members 82 in each of the openings 322 to electronically connect the second housing 30 to the first housing 10.

Figure 5:
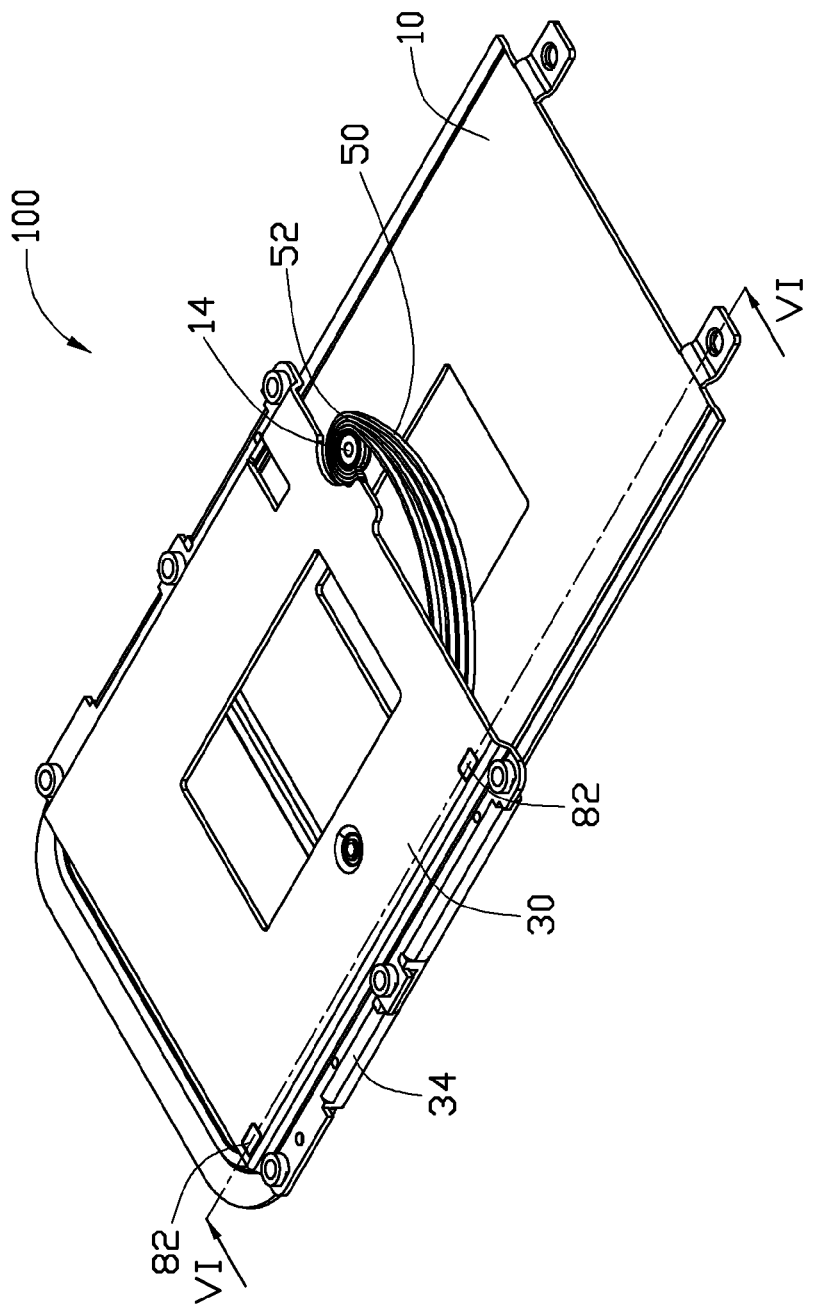
FIG. 5 is an assembled, schematic view of the portions of the electronic device.
Figure 6:
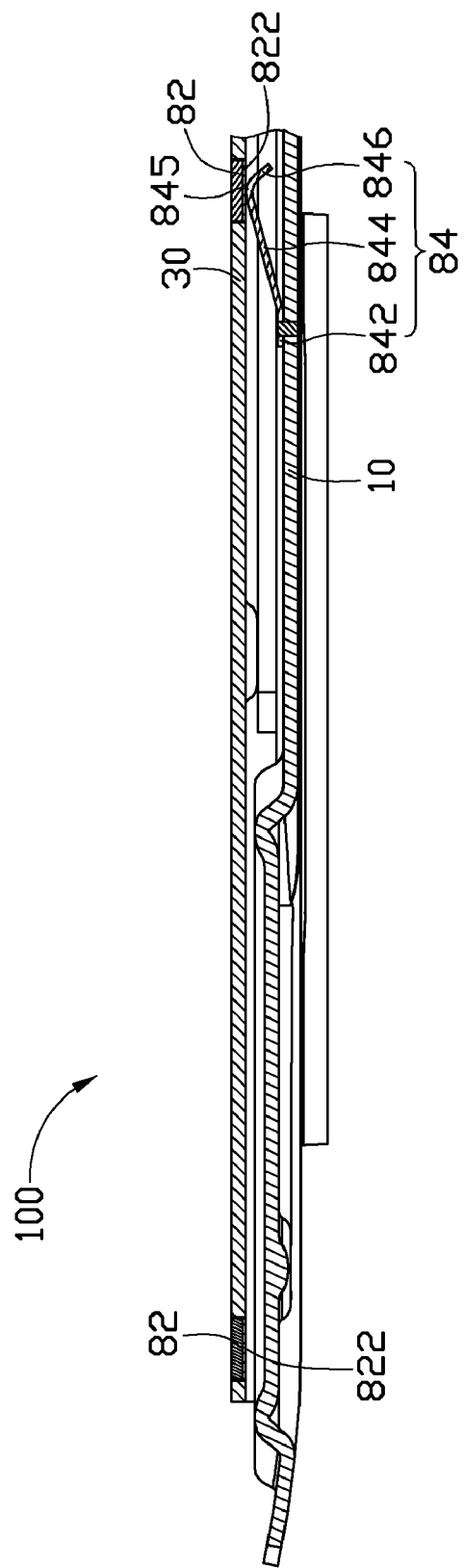
FIG. 6 is a cross-sectional view of FIG. 5 along line VI-VI thereof.

Referring to FIGS. 5 to 6, to assemble the electronic device 100, each conductive member 82 is received in its corresponding opening 322, and is welded to the second housing 30. The connecting portions 52 are respectively secured to the first post 14 of the first housing 10 and the second post 36 of the second housing 30. The rail portions 13 are received in and can linearly slide within the slide grooves 342. The second housing 30 is slidably attached to the first housing 10. The arcuate portion 845 contacts the conductive member 82 to electronically connect the second housing 30 to the first housing 10. Thus, the portable electronic device 100 is at an open state.

When the electronic device 100 is to be driven from the opened position to the closed position, the second housing 30 slides relative to the first housing 10. The arcuate portion 845 of the grounding tab 84 slides on the second housing 30 until the arcuate portion 845 contacts the other conductive member 82. Therefore, the first housing 10, the conductive member 82, the grounding tab 84, and the second housing 30 are electronically connected to a grounding pin of a main circuit board.

Figure 7:
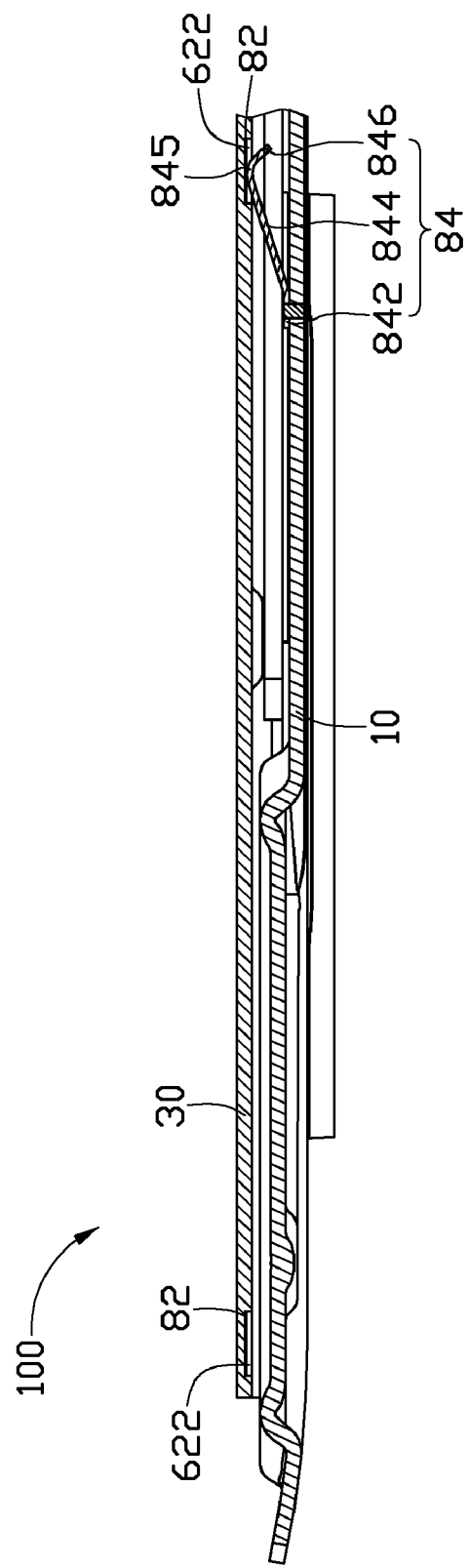
FIG. 7 is a cross-sectional view of FIG. 5 in another exemplary.

In another exemplary embodiment, referring to FIG. 7, the second housing 30 is etched to define two grooves 622. A depth of each groove 622 is about 0.5-1 mm thick. A gold layer 82 is coated in the grooves 622. The gold layer is about 20-250 nm thick depending on cost considerations and wear resistant quality desired and or needed. The arcuate portion 845 is received in a corresponding groove 622, and contacts the gold layer 82 in the grooves 622 to electronically connect the second housing 30 to the first housing 10. Thus, the portable electronic device 100 is at an open state.

The grooves 622 or the openings 322 define a receiving portion to receive the conductive member. The grounding mechanism is that the grounding tab is easily assembled to the first housing. This simplifies assembly of the electronic device so that costs are reduced. In addition, this structure may greatly reduce the wear of the conductive layer and provide a good conductivity.

It is to be understood, however, that even though numerous characteristics and advantages of the present disclosure have been set forth in the foregoing description, together with details of assembly and function, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic device comprising:
   a first housing;
   a grounding tab for attachment to the first housing;
   two conductive members;
   a second housing slidably attached to the first housing;
   two receiving portions formed in the second housing, the conductive members attached to the receiving portions of the second housing;
   wherein when the second housing slides relative to the first housing to a closed state or an open state, the grounding tab contacts one of the conductive members, the first housing is electrically connected to the second housing;
   wherein each receiving portion is a groove, a depth of each groove is about 0.5mm-1mm thick, a gold layer is coated in the groove to form the conductive member, the gold layer is about 20-250 nm thick;
   wherein the grounding tab includes a seat portion, an angled portion, an arcuate portion and an extending portion, the seat portion extends from one end of the angled portion, the seat portion defines two fastener holes for mounting the grounding tab to the first housing with fasteners, the arcuate portion is connected between the angled portion and the extending portion, the arcuate portion is received in a corresponding groove to contact the gold layer.

2. The electronic device as claimed in claim 1, wherein the first housing defines two receiving holes, the fastener holes are aligned with the receiving holes, and the fasteners extend through the fastener holes and the receiving holes to mounting the grounding tab to the first housing.

* * * * *